(12) United States Patent
Buchanan et al.

(10) Patent No.: US 9,691,483 B1
(45) Date of Patent: Jun. 27, 2017

(54) CONTENT ADDRESSABLE MEMORY WITH BANKS

(71) Applicant: Hewlett Packard Enterprise Development LP, Houston, TX (US)

(72) Inventors: Brent Buchanan, Fort Collins, CO (US); John Paul Strachan, San Carlos, CA (US); Le Zheng, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/270,087

(22) Filed: Sep. 20, 2016

(51) Int. Cl.
  *G11C 15/00* (2006.01)
  *G06F 3/06* (2006.01)
(52) U.S. Cl.
  CPC .......... *G11C 15/00* (2013.01); *G06F 3/0613* (2013.01); *G06F 3/0644* (2013.01); *G06F 3/0653* (2013.01); *G06F 3/0673* (2013.01)

(58) Field of Classification Search
  USPC ................... 365/49.1, 49.16, 49.17
  See application file for complete search history.

(56) References Cited

U.S. PATENT DOCUMENTS

2003/0095558 A1* 5/2003 Chung ............... H04L 12/5693
                                                                370/417

* cited by examiner

*Primary Examiner* — Vu Le
(74) *Attorney, Agent, or Firm* — Hewlett Packard Enterprise Patent Department

(57) ABSTRACT

In one aspect, techniques for providing a banked content addressable memory (CAM) with counters are provided. A dictionary word may be divided into a plurality of banks. A counter may be associated with each bank of the plurality of banks. The counter may count the number of times a segment of an input word aligned with the bank does not match. A scheduler may schedule comparison of banks with higher probability of not matching before banks with lower probability of not matching. The probability of not matching may be based on the counters.

20 Claims, 8 Drawing Sheets

CONTENT ADDRESSABLE MEMORY WITH BANKS

BACKGROUND

In a standard memory, a memory address is input, and the contents stored at that address are output. In a content addressable memory (CAM), the input is the desired content. The output is an indication of each memory address that contains the desired content. Content addressable memory is useful in many different applications, such as translation lookaside buffers, for example.

The CAM may include a plurality of dictionary entries whose content can be referred to as dictionary words. The content addressable memory may receive an input word, which contains the content that is desired to be found in the CAM. The CAM may then search the dictionary words to find all entries that contain the input word. An indication of all matching dictionary entries may then be returned.

In a CAM, all memory cells that comprise dictionary entry may be connected to a match line for that dictionary entry. The match line may be initially pre-charged. Each memory cell is then compared to its corresponding bit position in the input word. If a bit cell does not match, it causes the match line to discharge. As should be clear, if any bit cell does not match, the match line will be discharged. At the end of this operation, if the match line for the dictionary entry is still charged, the dictionary word contained in the dictionary entry matches the input word, otherwise, it does not. In general, all dictionary entries are compared to the input word in parallel.

DETAILED DESCRIPTION

Figure 1:
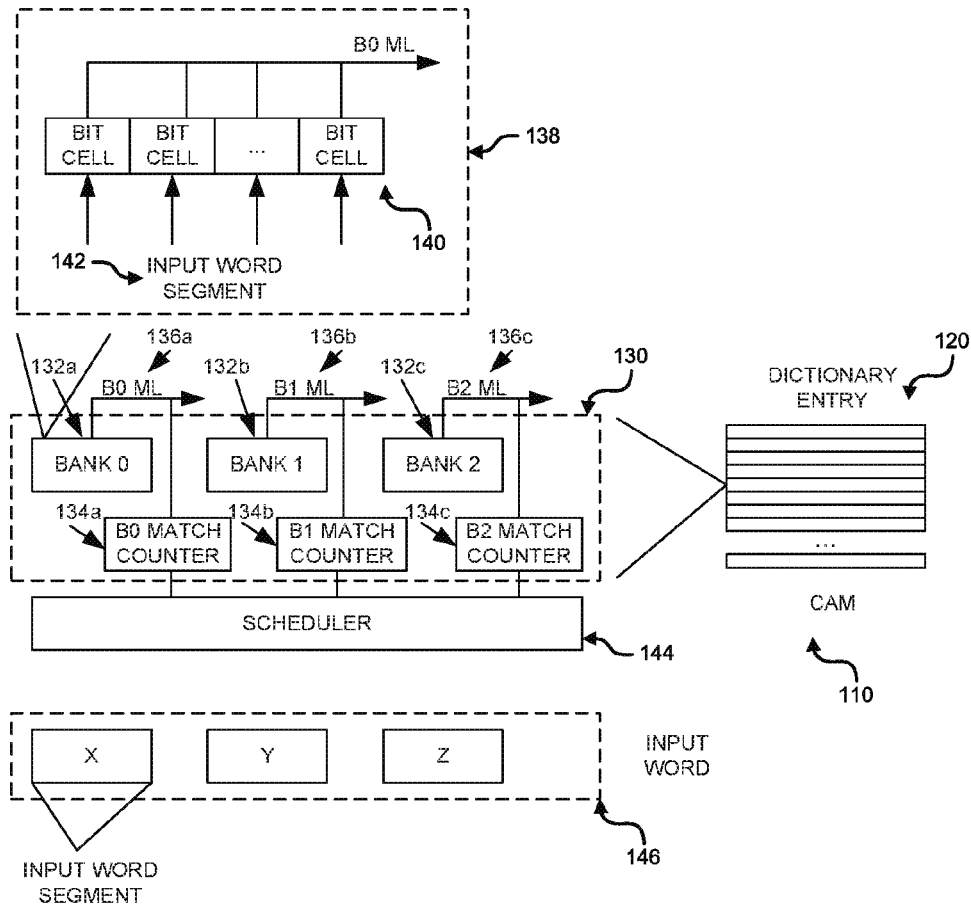
FIG. 1 is an example of a banked CAM including counters, according to techniques described herein.

Content addressable memories (CAM) find uses in many different applications. As described above, a CAM may include a match line for each dictionary entry. These match lines may be pre-charged priory to comparison with a dictionary word. Pre-charging the match line requires an amount of energy that is directly related to the size of the dictionary entry. In other words, for example, pre-charging a match line for 64 bit dictionary entries may use more energy than pre-charging a match line for a 32 bit entry. To overcome this problem, some CAMs include a banked structure, in which each dictionary entry is divided into several segments, called banks. Each segment for each dictionary entry may contain its own match line. Pre-charging the match line for a segment may use less power than pre-charging a match line for the entire dictionary entry.

The CAM may then cycle through each bank, checking to see if there is a match for that bank. If there is a match, any remaining banks are checked. If there is no match in a given bank, it is no longer necessary to test additional banks of that dictionary entry, as it is no longer possible for that dictionary entry to be a match. As such, there may be a power savings because in some cases, it may be determined that a particular dictionary entry will not match prior to going through all banks.

Although banked CAMs do provide some power savings over CAM implementations with a single match line per dictionary entry, using banks may also introduce other issues. For example, a banked CAM that checks banks in a defined order (e.g. from lowest numbered bank to highest numbered bank) may be inefficient due to the particular data that is stored in the CAM. For example, consider the hypothetical structure wherein a four digit hex number (e.g. 0xFFFF) is stored such that each digit is in its own bank. Assume that the following three dictionary words are stored: 0xffff, 0xfffa, 0xfff5. Assume that the input word is 0xfff5.

As should be clear, if the banked CAM checks banks in order of most significant bank (MSB) to least significant bank (LSB), all three dictionary entries would match for the first three banks. Essentially, the match line for all twelve banks (3 dictionary words*4 banks each) would need to be pre-charged in order to detect a match. However, if the order was reversed to check the LSB first, then upon the first iteration, the values 0xffff and 0xfffa would indicate no match possible on the first bank check. As a result, the remaining banks of those dictionary entries would no longer need to be checked, thus saving the power that would have been used to pre-charge the match lines of those banks. In this simplified example, only 6 bank match lines would have been pre-charged (4 from the matching entry, and the LSB of each of the two non-matching entries). In this simple example, the amount of power used to pre-charge bank match lines was halved.

The banked CAM approach may also cause problems related to throughput. In an unmodified CAM, verification of each dictionary word occurs in parallel, and essentially requires 1 cycle (wherein a cycle comprises pre-charging the match line and comparing the bit cells of each dictionary entry to the input word). In a banked CAM, the number of cycles required can, in the best case be one cycle (e.g. when the first bank check indicates no matches). However, in the worst case, the number of cycles needed may be equivalent to the total number of banks. This is because a match cannot be definitively determined until each bank of a dictionary entry that possibly matches the input word is checked.

Because the banked CAM may require multiple cycles to determine a match, the overall throughput may be reduced. Furthermore, such an implementation may be inefficient, because for a large portion of the time, only one bank is being checked, while all other banks remain idle.

The techniques described herein overcome these problems and others. In one example implementation, a counter is maintained for each bank of each dictionary entry. The counter may keep track of the number of times that particular bank of that particular dictionary word resulted in a mismatch. As should be clear, the higher the count, the more often that particular bank resulted in a mismatch. Counters with higher values indicate which banks on which dictionary entries have a higher probability of mismatching. A scheduler may schedule comparisons on input words based on these probabilities. By selecting a bank on a dictionary word that has a higher probability of mismatching first, the CAM may eliminate dictionary words earlier, rather than having to waste time and power going through each bank in some predefined order.

In another example implementation, techniques herein take advantage of the fact that in a banked CAM, each input word is being compared to a single bank at a time, thus leaving those other banks essentially idle. The techniques described herein allow for comparison of multiple input words simultaneously. A scheduler may receive multiple input words. For each input word, the match process occurs on a different bank. Because the comparisons are being done on different banks, multiple input words can be compared in parallel. Thus, the overall throughput of the CAM may be improved.

Throughout the remainder of this description CAM is used to refer to a content addressable memory. However, it should be understood that the techniques are applicable whenever there is a banked structure with independent match lines for each bank. The techniques are not limited to any specific structure. Furthermore, it should be understood that the techniques described herein are also applicable to ternary content addressable memories (TCAM). However, for purposes of ease of description, the term CAM will be used to include any circuitry that implements a CAM or a TCAM, as long as the per-bank match line properties described above are present.

FIG. 1 is an example of a banked CAM including counters, according to techniques described herein. CAM 110 may include a plurality of dictionary entries 120. The techniques described herein are applicable regardless of the number of dictionary entries present in the CAM. Furthermore, the techniques described herein are not limited to dictionary entries of any particular size. For example, the CAM may contain dictionary entries that are 1 bit, 4 bits, 8 bits, 16 bits, 64 bits, or any other number of bits in length. What should be understood is that all dictionary entries within the CAM are the same size, regardless of what that size is.

Each dictionary entry 120 may contain data, referred to as a dictionary word. In other words, the content stored in a given dictionary entry may be referred to as the dictionary word that is stored in that entry. When the CAM is operated, an input word may be compared against all dictionary words stored in the CAM. Dictionary entries containing dictionary words that match the input word are indicated as a match. The match may be indicated through an assertion of a match line associated with the dictionary entry, by a numeric identifier of the dictionary entry (e.g. an index number or offset), or by any other suitable mechanism. The techniques described herein are not limited by the particular mechanism used to provide external identification of dictionary entries that match, but rather are provided to determine which dictionary entries contain dictionary words that match an input word.

A single dictionary entry 130 is shown in more detail. It should be understood that each dictionary entry 120 may include a structure that is similar to the detail view 130. A dictionary entry may include a plurality of banks 132-a-c. Each bank may be aligned with a portion of the dictionary entry. For example, if a dictionary entry is 24 bits, each bank may be associated with 8 bits of the dictionary entry. In other words, the dictionary entry may be partitioned into multiple banks. Although the banks may generally be of equivalent size, the techniques described herein are not limited to banks of equivalent size.

Each bank may be associated with a match counter 134-a-c. As will be described in further detail below, the match counter may be used to keep track of how many times a particular bank of a dictionary entry is a mismatch for a given input word. Each bank may also be associated with a bank match line 136-a-c. The bank match line may indicate if a particular bank is a match for a given segment of an input word, as will be described in further detail below.

An individual bank 138 may include a plurality of bit cells 140. In one implementation, each bit cell may contain circuitry to store an individual bit of a dictionary entry. The bit cell may also include circuitry to receive an input word segment, as will be described in further detail below. The bit cells within a bank may all be coupled to a single match line associated with the bank. In operation, the match line associated with the bank may be pre-charged. Each bit cell may then be compared with a corresponding bit in the input word. In the case of a match (or in a ternary CAM, a don't care condition), the bit cell causes no change to the match line. In the case of a mismatch, the bit cell may cause the match line for the bank to discharge. A discharged match line indicates at least one bit cell in the bank did not match the input word, and as such the dictionary word stored in the dictionary entry cannot be a match to the input word.

The CAM 110 may also include a scheduler 144. The scheduler may be responsible for selecting which bank of a dictionary entry to check against an input word first. It should be noted that the scheduler need not select the same bank for all dictionary entries. Instead, the scheduler may select a bank for each dictionary entry based on the bank that is most likely to result in a mismatch between the input word segment and the initially selected bank for that dictionary entry. The scheduler may also keep track of which banks have been compared to the input word, and upon a mismatch, may select the next most likely bank for a mismatch as the next bank to compare. Operation of the scheduler is described in further detail below.

CAM 110 may receive an input word 146 for comparison to the dictionary entries. The input word may be divided into segments, with each segment aligned to the banks 132 described above. For example, if the dictionary entry is 24 bits, divided into three banks of 8 bits each, the input word may also be divided into three input word segments of 8 bits each. As shown, the example input word contains three input word segments containing the values X, Y, and Z. It should be understood that the variables X, Y, and Z are simply aids being used to simplify the discussion. A bank is considered a match if the input word segment aligned to the bank for a given dictionary entry matches what is in that entry. For example, if an input word segment is indicated as X, and the bank associated with a dictionary entry also contains X, this results in a match for the bank. If the bank holds anything other than X, this indicates a mismatch. What should be understood is that the variables are not intended to indicate a character, or some literal value, but rather are just identifiers to provide an easy way of referring to the content of the input word segment or the content of a dictionary entry for a given bank. Operation of the CAM described in FIG. 1 is provided below, with respect to FIG. 2.

FIG. 2(A,B) is an example of using the banked CAM including counters describe in FIG. 1. To aid in the ease of discussion, only a single dictionary entry is described. However, it should be understood that the process described occurs for all dictionary entries, and actually may occur for all dictionary entries in parallel.

Figure 2A:
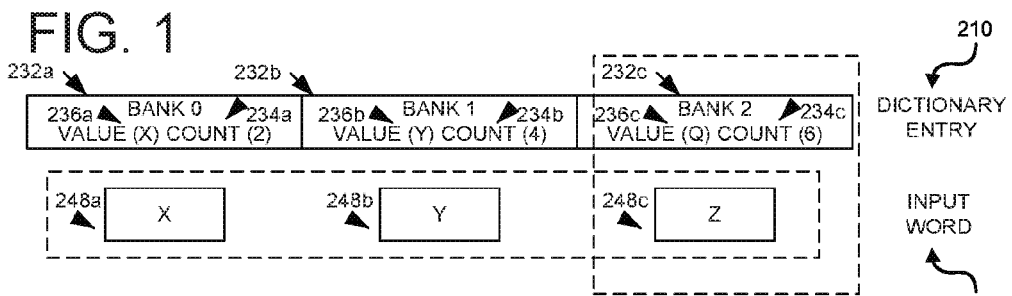
FIG. 2(A,B) is an example of using the banked CAM including counters describe in FIG. 1.

FIG. 2A depicts an example dictionary entry 210. As explained above, each dictionary entry may be divided into a number of banks. Shown here, the dictionary entry is divided into three banks 232(a-c). Each bank may be associated with a counter 234(a-c) that counts the number of times there is a mismatch when comparing a segment of an input word and the contents of the bank. In the present example, the counts for each bank are shown as 2, 4, and 6 respectively. This means for this example, comparison of bank 232a to an input word segment was a mismatch 2 times, comparison of bank 232b to an input word segment was a mismatch 4 times and comparison of bank 232c to an input word segment was a mismatch 6 times.

In the present example, bank 232a contains the variable X 236a, bank 232b contains the variable Y 236b, and bank 232c contains the variable Q 236c. In other words, the dictionary word stored in the depicted dictionary entry 210 is XYQ.

In operation, an input word 246 may be received. In the example shown, the input word is XYZ. The input word may be divided into a plurality of segments, with the segments aligned to the banks of the dictionary entry. As shown, the input word may be divided into segments 248(a-c). The segments 248(a-c) of the input word may align with the banks 232(a-c).

In operation, the scheduler 144 may determine the bank with the highest probability of a mismatch based on the counters 234. Here, counter 234c has the largest value, and thus has the highest probability of a mismatch. The scheduler may cause the bank match line 136c to be pre-charged. The bit cells within the bank 132c may then compare the segment of the input word that aligns with bank 132c to the variable stored in the bank. In this case, input word segment 248c contains the variable Z, while bank 132c contains the variable Q. As a result, the match line 136c for bank 132c is discharged, and it becomes known that dictionary entry 210 does not match the input word. Because of the mismatch, the count 234c for bank 232c is incremented (as is shown in FIG. 2B).

It should be noted that in this example, a mismatch was detected upon the first bank comparison. In a naïve approach, where banks were simply compared from left to right, it would have required comparisons of banks 232a and 232b to be completed first. By selecting to compare the bank with the highest probability of mismatching first, it is possible to reduce the number of banks whose match lines will be pre-charged, thus reducing the overall amount of energy used by the CAM.

Figure 2B:
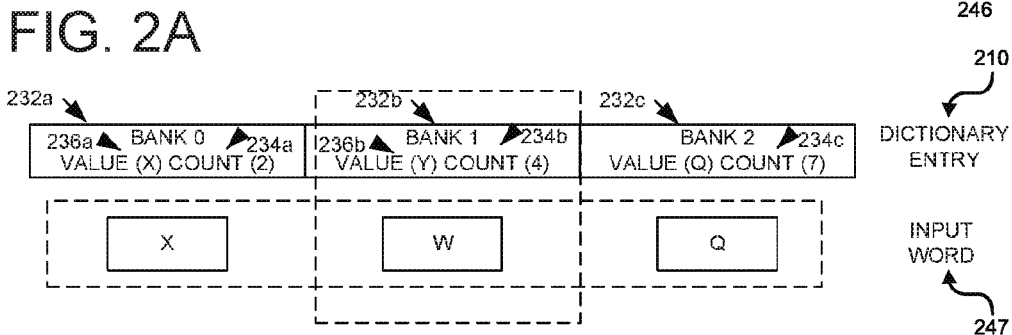

FIG. 2B depicts the example dictionary entry 210 after the processing described with respect to FIG. 2A. The only difference between the dictionary entries described in FIGS. 2A and 2B is that the count 234c for bank 232c has been incremented by 1, to contain the value 7, to reflect the mismatch that was detected with respect to the description above.

A new input word 247 may be received. In this case, the new input word is XWQ. The scheduler 144 begins just as it did before. The scheduler first determines the bank with the highest count, which therefore has the highest probability of being a mismatch. The bank match line for that bank is then pre-charged, and the segment of the input word that aligns with the bank is compared to determine if there is a match. In this case, the bank 232c is still the bank with the highest count. However, as shown, the segment of the input word 247 that aligns with bank 232c contains the variable Q, which is also contained in bank 232c, resulting in a match.

The scheduler may then determine the bank with the next highest probability of being a mismatch that has not already been checked. In this case, bank 232b has a count 234b of 4, which is the next highest count (indicating he next highest probability). As shown, the segment of the input word that aligns with bank 232b contains the variable W, which is a mismatch. The entire dictionary entry may then be marked as being a mismatch.

The process described above may be repeated for each bank, until either all banks have been checked or a bank is indicated as a mismatch, thus terminating the process. If all banks have been checked and there is no mismatch, the dictionary entry stores a dictionary word that is a match for the input word. All such dictionary entries in the CAM that are a match may be indicated. For all dictionary entries that have at least one bank that resulted in a mismatch, the entries do not contain dictionary words that match the input word.

Figure 3:
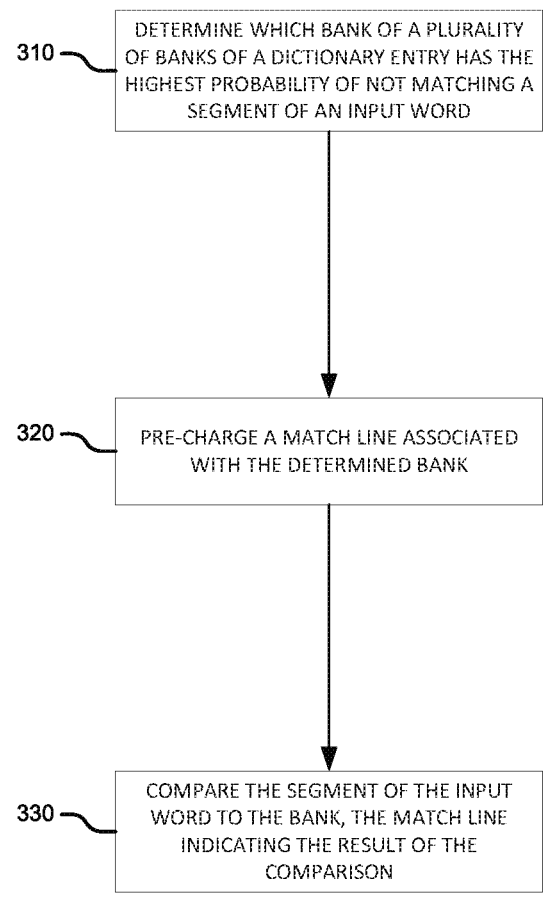
FIG. 3 is an example of a high level flow diagram for a banked CAM including counters according to techniques described herein.

FIG. 3 is an example of a high level flow diagram for a banked CAM including counters according to techniques described herein. In block 310, it may be determined which bank of a plurality of banks of a dictionary entry has the highest probability of not matching a segment of an input word. As described above, banks that have a higher probability of not matching may be selected first for comparison. If there is a mismatch, the power used to pre-charge the match lines for the remaining banks may be saved, as there would no longer be a need for checking those remaining banks.

In block 320, a match line associated with the determined bank may be pre-charged. As described above, there is no need for the same bank to be selected for each dictionary entry. Instead, the bank with the greatest probability for mismatching in each dictionary word may be selected, and the match line for that bank pre-charged.

In block 330, the segment of the input word maybe compared to the bank. The match line may indicate the result of the comparison. If the match line indicates there is not a match for a given bank of a given dictionary entry, then there is no longer a need to check any additional banks for that dictionary entry, because a match on the entire dictionary entry is no longer possible.

Figure 4:
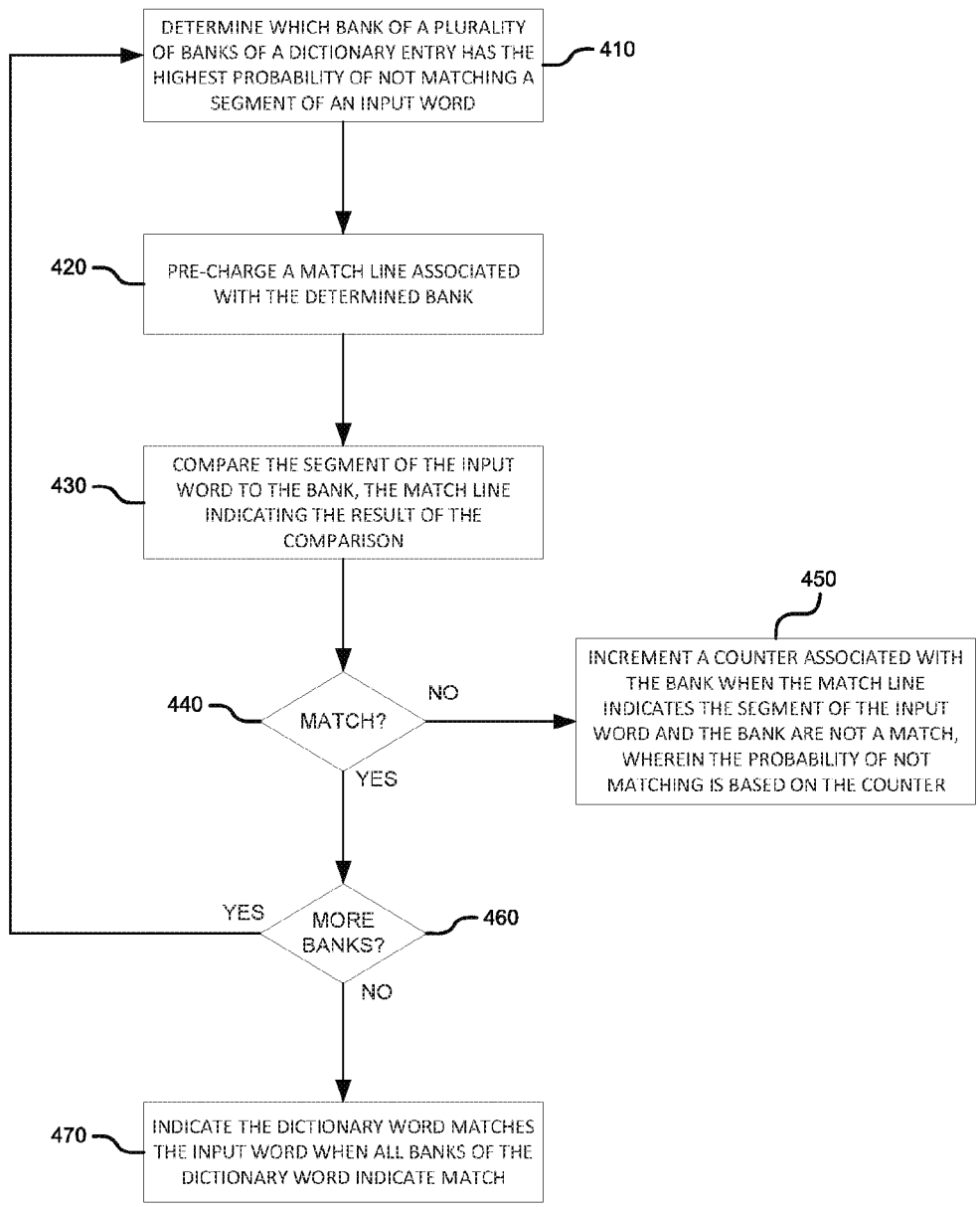
FIG. 4 is another example of a high level flow diagram for a banked CAM including counters according to techniques described herein.

FIG. 4 is another example of a high level flow diagram for a banked CAM including counters according to techniques described herein. In block 410, just as above in block 310, it may be determined which bank of a plurality of banks of a dictionary entry has the highest probability of not matching a segment of an input word. In block 420, just as in block 320, a match line associated with the determined bank may be pre-charged. In block 430, just as in block 330, the segment of the input word may be compared with the bank. The match line for the bank may indicate the result of the comparison.

In block 440, it may be determined if there is a match between the bank being compared and the segment of the input word. If there is no match, the process moves to block 450. In block 450, a counter associated with the bank may be incremented when the match line indicates the segment of the input word and the bank are not a match. The probability of not matching may be based on the counter. Furthermore, because there is no longer a possibility of this particular dictionary entry being a match for the entire input word, the remaining banks of the dictionary entry no longer need to be checked. Thus, the energy used to pre-charge the match lines of those remaining banks does not need to be wasted, because regardless of the result of those checks, the dictionary entry cannot match the input word.

If it is determined in block 440 that the bank does match the segment of the input word, then the process moves to block 460. In block 460, it may be determined if there are more banks. In other words, it may be determined if there are additional banks for the dictionary entry that have not yet been compared with the associated segment of the input words. If there are additional banks, the process returns to block 410. Upon the next execution, the bank with the next highest probability of not matching is selected.

If there are no more banks remaining to be checked, the process moves to block 470. In block 470, it may be indicated that the dictionary word matches the input word when all banks of the dictionary word indicate a match. In other words, all banks of the dictionary word have been checked against each associated segment of the input word and no mismatch was identified. As such, the dictionary entry that stores the dictionary word is a match for the input word.

FIGS. 5(A-E) are an example of a high throughput banked CAM according to techniques described herein. In the examples presented above, a single bank of the CAM was compared to a segment of an input word. The remaining banks were left idle. The techniques described herein provide for the ability to allow multiple banks of a CAM to be used at the same time, with each bank being compared to a different input word, thus allowing for multiple input words to be checked in parallel.

CAM 510 may have a similar structure to that presented with respect to FIG. 1. Mainly, each dictionary entry of the CAM may be divided into multiple banks. Each bank may contain its own match line. For purposes of ease of description, many of the details presented with respect to FIG. 1 are omitted here. However, in this example implementation there are no per bank, per entry counters. For purposes of this example implementation, the dictionary words 512 are labeled 0-3. Each dictionary word is divided into 4 banks, labeled B0, B1, B2, and B3 respectively.

The CAM 510 may also include a scheduler 520. The scheduler may receive input words and cause segments of those input words to be compared with the dictionary words stored in the CAM. The scheduler may maintain data 530 that may be used to allow for multiple input words to be compared against the CAM in parallel. For example, the data may include two input words 531. The data associated with each word is listed under the columns labeled word 1 and word 2. Although two input words are shown, it should be understood that this is for ease of explanation, rather than by way of limitation. Techniques described herein may be usable to compare, in parallel, a number of input words equivalent to the number of banks.

A done structure 532 may be maintained for each input word. The done structure may indicate which banks of the input word have been compared to which banks of the dictionary entries. In the present example, the done structure for each input word is a 4 bit entry, with each bit representing a bank, in which a 0 value indicates the bank has not yet been compared, while a 1 indicates a bank has already been compared. For example, the leftmost bit may indicate the comparison status of bank B0, while the rightmost bit indicates the status of bank B3.

A current structure 533 may indicate which bank is currently being compared for that input word. What should be clear is that as long as both input words are being compared against different banks of the dictionary entries, the comparisons can be done in parallel. Thus, in some implementations, it is actually possible to have as many input words as there are banks, because on any given cycle, each input word could be assigned to a different bank, thus ensuring that each input word does not interfere with the comparison of any other input word.

A dictionary word match structure 534 may indicate for each input word which dictionary entries have already been determined to not match. For example, if after comparing a bank of a dictionary entry to a segment of an input word that aligns to the bank it can be determined that the bank is a mismatch, then it can also be determined that the entire entry is a mismatch. The reason being that once a single bank of a dictionary entry is a mismatch for an input word segment for a given word, the entire dictionary word stored in that entry cannot possible match the given input word. The dictionary word match structure may keep track of which dictionary entries have already been determined to not match the input word.

Figure 5A:
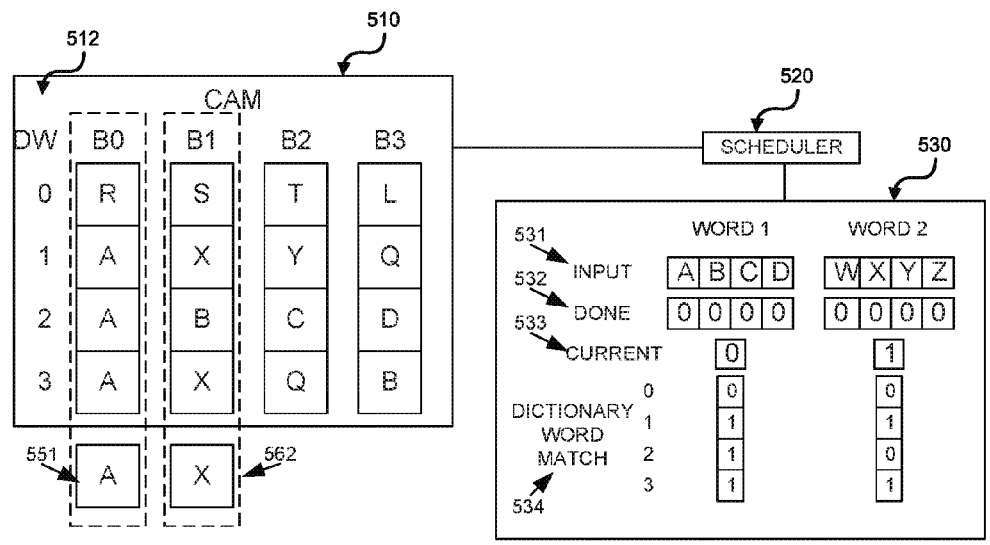
FIGS. 5(A-E) are an example of a high throughput banked CAM according to techniques described herein.

FIG. 5A depicts an initial condition, in which two input words 531 are provided. In this example, the two input words are represented by the variables ABCD and WXYZ. As shown, the input words are divided into segments that align with the banks B0-B3 of the CAM 510. The contents of each dictionary entry are RSTL, AXYQ, ABCD, and AXQB respectively.

In the first pass, shown in FIG. 5A, the scheduler may determine that input word 1 will be compared to bank 0, while input word 2 will be compared to bank 1. It should be understood that this assignment scheme is merely an example. The techniques described herein are not limited to any particular assignment scheme, so long as each input word is assigned to a different bank from all other input words. The bank match lines for bank 0 and bank 1 may be pre-charged for each dictionary entry.

The banks may then be compared to the input word segment that aligns with the bank. For example, as shown, input word 1 is to be compared against bank 0. The input word segment of input word 1 that aligns with bank 0 is variable A 551. Likewise, the input word segment of input word 2 that aligns with bank 1 is variable X 562. For bank one, it is shown that dictionary entry 0 does not match, while entries 1-3 do. As a result the bank match line for entry 0 will be discharged, indicating a mismatch for input word 1, bank 0. This mismatch is reflected in the dictionary word match structure 534 by entering a zero in the structure. Likewise, for input word 2, entries 0 and 2 are mismatches in bank 1. This is also stored in dictionary word match structure. It should be noted that dictionary word match structure 534 does not need to keep track of which bank causes a mismatch for a given input word, because so long as any bank is a mismatch for a given input word, the entire dictionary word will be a mismatch for that given input word.

Figure 5B:
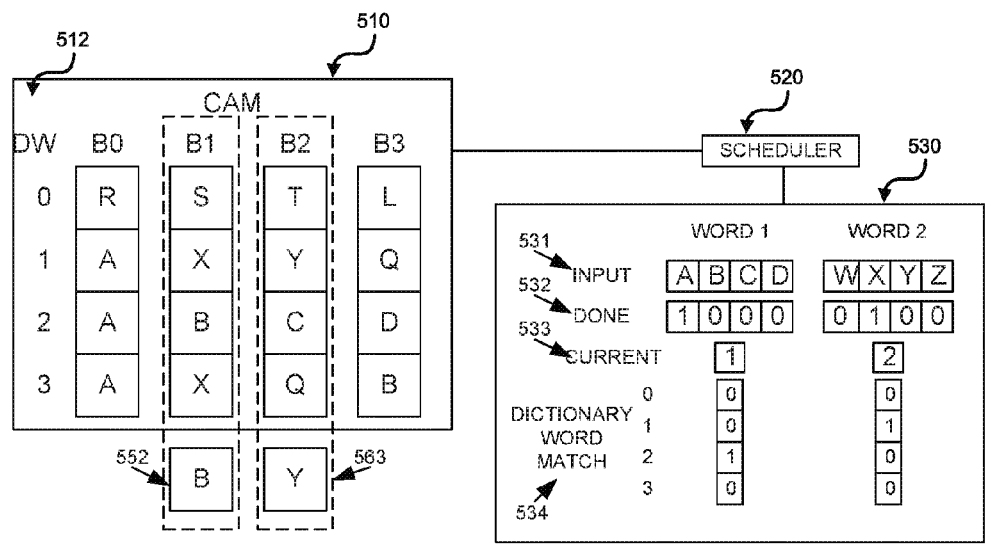

FIG. 5B is the next cycle in the process. As shown, the done status 532 is updated to indicate which banks of the dictionary entries for each input word has been completed. As shown, bank 0 for input word 1 is complete as indicted by the 1 in the first bit position. Likewise, bank 1 for input word 2 has been completed as indicted by the 1 in the second bit position. The current bank 533 for each input word is then shifted to a previously un-compared bank. In one example implementation, the banks may simply be increased by 1 on each cycle (until the end is reached when it wraps back around to bank 0) until all possible banks are checked. However it should be understood that the techniques described herein are not so limited. Any selection algorithm that selects a previously un-compared bank and does not allow for two input words to select the same bank would work equivalently.

The second segment of input word 1 contains the variable B 552 and is compared to bank 1. Likewise the third segment of input word 2 is contains the variable Y 563, and is compared to bank 2. What should be understood is that prior to pre-charging the bank match lines of banks 1 and 2, the dictionary word match structure 534 may be examined to determine which bank match lines to charge. As shown in FIG. 5A, for input word 1, it is clear that dictionary entry 0 cannot be a match. Likewise, for input word 2, dictionary entries 0 and 2 cannot be a match. Thus, pre-charging those bank lines is not necessary. A power savings can be achieved by not pre-charging unnecessary bank match lines. Although the present example uses the dictionary word match structure 534 to keep track of which dictionary words have already been determined to not match (and thus no longer need to have the match lines of additional banks for those entries pre-charged), the techniques described herein are not limited to such a structure. What should be understood is that once it has been determined that a dictionary word cannot match for a given input word, there is no longer a need to pre-charge the bank match lines for any more of the banks of that dictionary entry, thus saving the power used in the pre-charge operation. The reason being that once a single bank of a dictionary entry has been determined to not match a given input word, it is impossible for that dictionary word to match the input word (even if the remaining banks are a match).

After the comparison, the dictionary word match structure can be updated. As shown, for input word 1, bank 1 552, there is a match in dictionary entry 2. Dictionary entries 1 and 3 were mismatches, so those values are set to zero. Dictionary word 0 was previously determined in FIG. 5A not to match, and its entry in the dictionary word match structure remains 0. For input word 2, bank 2, 563, there is a match in entry 1. Entry 3 is a mismatch, and entries 0 and 2 were previously determined to be mismatches in FIG. 5A.

Figure 5C:
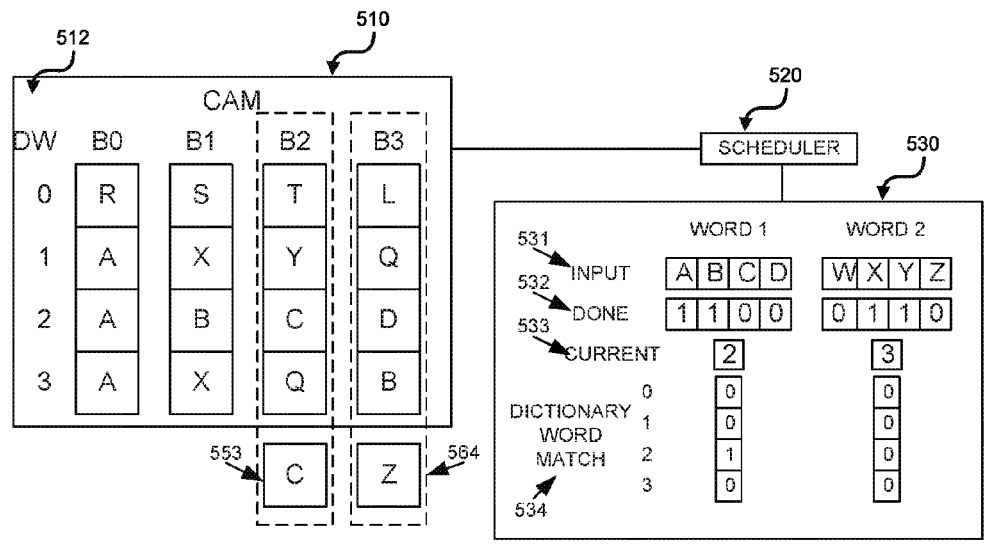

FIG. 5C is the next cycle in the process. As shown, the done status 532 is updated to indicate which banks of the dictionary entries for each input word has been completed. As shown, bank 1 for input word 1 is complete as indicted by the 1 in the second bit position. Likewise, bank 2 for input word 2 has been completed as indicted by the 1 in the third bit position. The current bank 533 for each input word is then shifted to the next bank. Again, the particular mechanism for selection of the next bank is relatively unimportant, so long as it is a previously unchecked bank, and each input word has a different bank selected.

The third segment of input word 1 contains the variable C 553 and is compared to bank 2. Likewise the fourth segment of input word 2 contains the variable Z 564, and is compared to bank 3. What should be understood is that prior to pre-charging the bank match lines of banks 1 and 2, the dictionary word match structure 534 may be examined to determine which bank match lines to charge. In other words, bank match lines are not pre-charged for dictionary entries that have already been determined to not match the input word that is being compared. As shown in FIG. 5B, for input word 1, it is clear that dictionary entries 0, 1, and 3 cannot be a match. Likewise, for input word 2, dictionary entries 0, 2, and 3 cannot be a match. Thus, pre-charging those bank lines for those dictionary entries is not necessary. A power savings can be achieved by not pre-charging unnecessary bank match lines.

After the comparison, the dictionary word match structure can be updated. As shown, for input word 1, bank 2 553, there is a match in dictionary entry 2. Dictionary entries 0, 1 and 3 were already determined to be mismatches. For input word 2, bank 3, 564, there is a mismatch in entry 1. Entries 0, 2, and 3 were already determined to be mismatches.

Figure 5D:
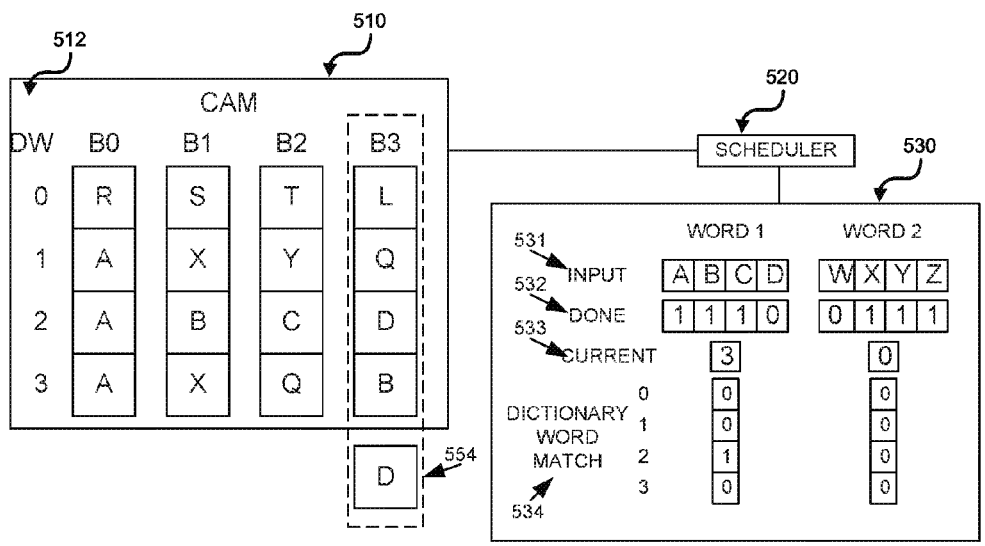

FIG. 5D is the next cycle in the process. As shown, the done status 532 is updated to indicate which banks of the dictionary entries for each input word has been completed. As shown, bank 2 for input word 1 is complete as indicted by the 1 in the third bit position. Likewise, bank 3 for input word 2 has been completed as indicted by the 1 in the fourth bit position. The current bank 533 for each input word is then shifted to the next bank. Again, the particular mechanism for selection of the next bank is relatively unimportant, so long as it is a previously unchecked bank, and each input word has a different bank selected. As shown, because the last bank checked for input word 2 was bank 3, the bank wraps around to return to bank 0, which had not been previously checked.

The fourth segment of input word 1 contains the variable D 554 and is compared to bank 3. What should be noted is that for input word 2, the dictionary word match 534 indicates that no dictionary entries remain to be possible matches. There is no need to pre-charge any of the bank match lines for comparison to input word 2, as there is no longer any possibility that any of the dictionary. As such, there is no need to compare the first segment of input word 2 to any additional banks, because there are no dictionary entries that can possibly be matches. Thus, only the bank match line for bank 3, dictionary entry 2 is pre-charged. All other banks of all other dictionary entries remain un-charged, thus saving power.

After the comparison, the dictionary word match structure can be updated. As shown, for input word 1, bank 3 554, there is a match in dictionary entry 2. Dictionary entries 0, 1 and 3 were already determined to be mismatches. For input word 2, all banks had already been determined to be mismatches.

Figure 5E:
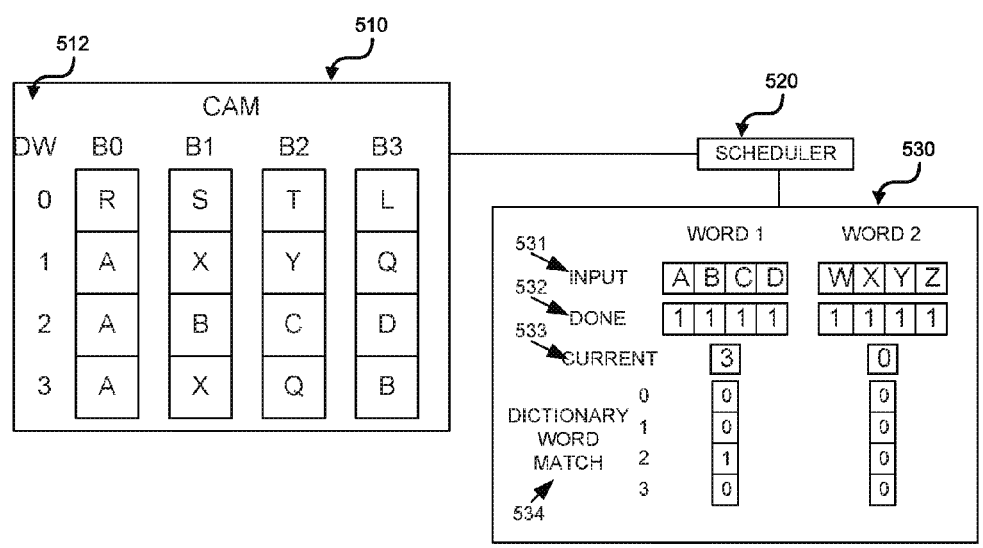

FIG. 5E is the final cycle in the process. As shown, the done structure 532 for all banks for input word 1 is indicated as all banks having been compared. As such, any dictionary entry in the dictionary word match that still indicates a match means that the dictionary word stored at that dictionary entry is a match for the input word. Here, dictionary entry 2 is still indicted as being a match after all banks have been checked. For input word 2, it can be seen that all entries for the dictionary word match structure are 0, indicating that there are no dictionary words stored that match input word 2. It does not matter that all banks have not actually been checked, as it is not possible for there to be a match to any dictionary entry.

Figure 6:
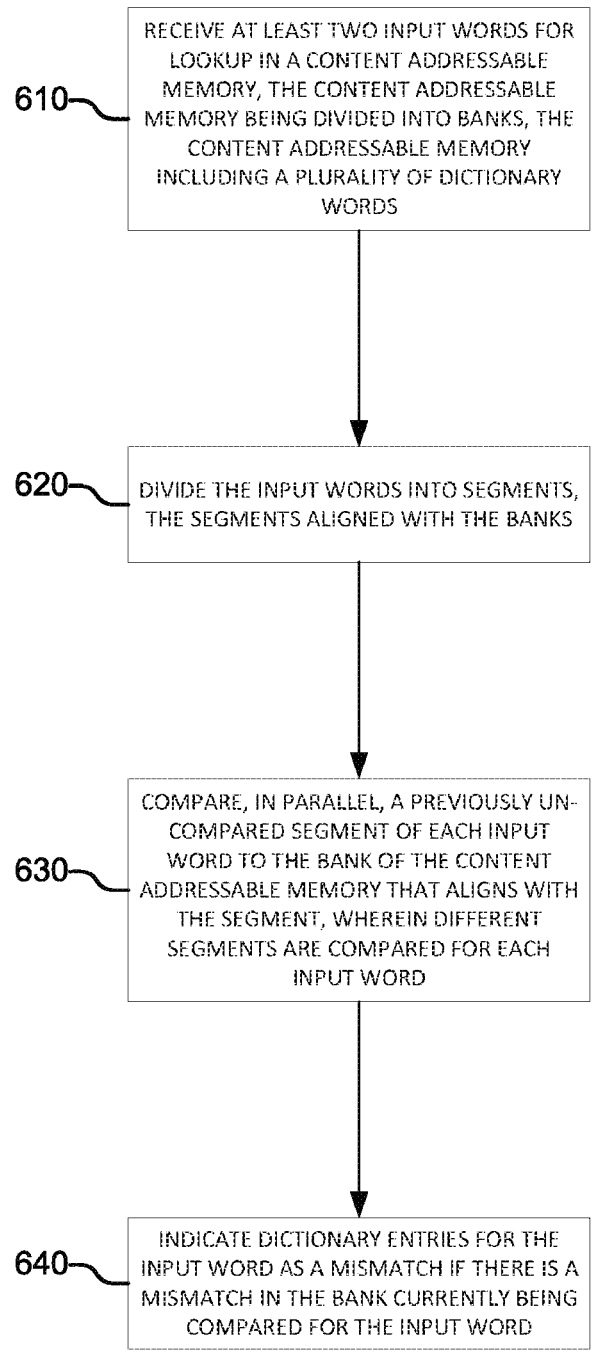
FIG. 6 is an example of a high level flow diagram for a high throughput banked CAM according to techniques described herein.

FIG. 6 is an example of a high level flow diagram for a high throughput banked CAM according to techniques described herein. In block 610, at least two input words for lookup in a content addressable memory may be received. The content addressable memory may be divided into banks. The content addressable memory may include a plurality of dictionary words. In other words, a CAM according to techniques described herein may be a banked CAM as described above with respect to FIGS. 5(A-E). The CAM may include a plurality of dictionary entries, each entry storing a dictionary word.

In block 620, the input words may be divided into segments. The segments may be aligned with the banks. In other words, the input words are divided such that the divisions of the input word are aligned with the banks of the CAM. As such, comparison of every segment of the input word to each bank is the equivalent of comparing the entire input word to the entire dictionary entry.

In block 630, a previously un-compared segment of each input word may be compared, in parallel, to the bank to the bank of the content addressable memory that aligns with the segment. Different segments are compared for each input word. In other words, a segment of the first input word is compared to the bank aligned with that segment, for all dictionary entries. A different segment (and therefore different bank) of the second input word is compared to the dictionary entries in parallel. This is possible because different banks are being checked for different input words. Although only two input words are described, it should be understood that these techniques are extendible to allow for as many input words to be checked simultaneously as there are banks. The reason for this is that each input word is checked against one bank at a time, thus leaving all remaining banks available to be checked against different input words.

In block 640, dictionary entries for the input word may be indicated as a mismatch if there is a mismatch in the bank currently being compared for the input word. In other words, once a bank has been determined to be a mismatch to a given input word for a given dictionary entry, the entire dictionary entry can be indicated as a mismatch, regardless of if there are additional banks remaining to be checked for that dictionary entry. Once any one bank in the dictionary entry is a mismatch, it is not possible for the entire dictionary entry to be a match to the input word. There is no longer any need to continue checking that particular dictionary entry for a match to that particular input word.

Figure 7:
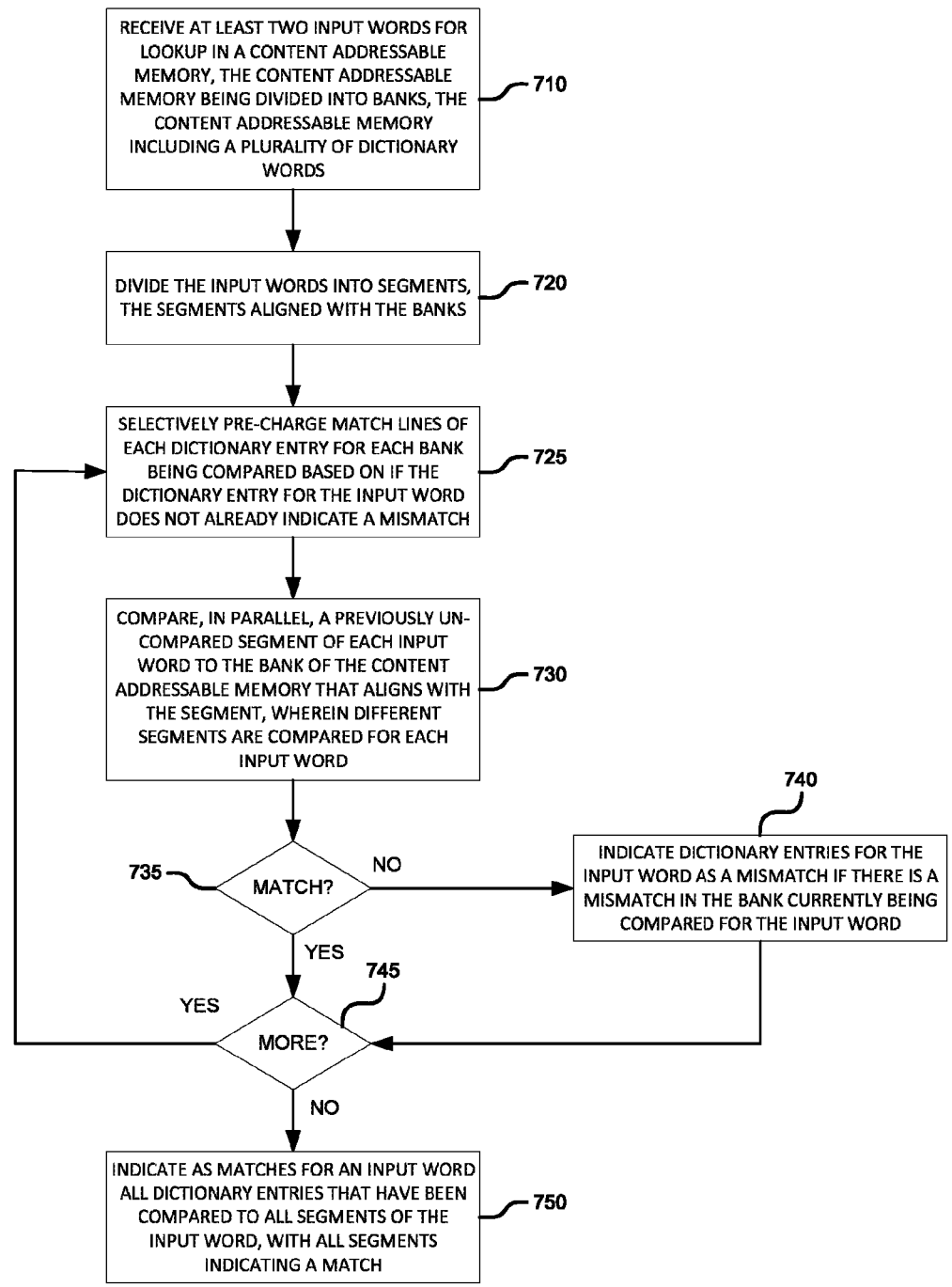
FIG. 7 is another example of a high level flow diagram for a high throughput banked CAM according to techniques described herein.

FIG. 7 is another example of a high level flow diagram for a high throughput banked CAM according to techniques described herein. In block 710, just as in block 610, at least two input words for lookup in a content addressable memory may be received. The content addressable memory may be divided into banks and include a plurality of dictionary words. In block 720, just as in block 620, the input words may be divided into segments. The segments may be aligned with the banks.

In block 725, the match lines of each dictionary entry may be selectively pre-charged for each bank being compared based on if the dictionary entry for the input word does not already indicate a mismatch. In other words, for dictionary entries that have already been determined to not match the input word, there is no reason to pre-charge the match lines for the bank being currently compared for that input word. As explained above, once a dictionary entry is indicated as a mismatch for a particular input word, it is no longer necessary to check any additional banks for that dictionary entry.

In block 730, just as in block 630, a parallel comparison of a previously un-compared segment of each input word to the bank of the content addressable memory that aligns with the segment. Different segments may be compared for each input word.

In block 735, it may be determined if there is a match for the banks being compared for each input word for each dictionary entry. If there is no match, the process moves to block 740. In block 740, dictionary entries for the input word may be indicated as a mismatch if there is a mismatch in the bank currently being compared for the input word. In other words, for each input word, a previously un-compared bank is selected. For those dictionary entries in which there is a mismatch for the bank, the entire dictionary entry is indicated as being a mismatch. In future iterations, there is no longer a need to compare those indicated dictionary entries to the mismatched input word, because it would not be possible for there to be a match.

If there is a match in block 735, the process moves to block 745. In block 745, it may be determined if there are more banks to be checked. If there are more banks to be checked, the process returns to block 725, wherein the process continues with the next previously un-compared bank. If there are no more banks to be checked, the process moves to block 750.

In block 750, all dictionary entries that have been compared to all segments of the input word, with all segments indicating a match, may be indicated as matches for the input word. In other words, each dictionary entry that has matched the segments of an input word for all banks may be indicated as a match for the input word. If any bank for a dictionary entry is indicated as a mismatch for the corresponding segment of the input word, the dictionary entry would have already been indicated as a mismatch in block 740.

We claim:

1. A content addressable memory (CAM) comprising:
   a dictionary entry divided into a plurality of banks;
   a counter associated with each bank of the plurality of banks, the counter counting the number of times a segment of an input word aligned with the bank does not match; and
   a scheduler to schedule comparison of banks with higher probability of not matching before banks with lower probability of not matching, the probability of not matching based on the counters.

2. The CAM of claim 1 wherein the CAM is a ternary CAM (TCAM).

3. The CAM of claim 1 wherein each bank further comprises:
   a match line associated with the bank, wherein the match line is pre-charged when the bank is to be compared to the segment of the input word aligned with the bank and is otherwise not pre-charged.

4. The CAM of claim 3 further comprising:
   a plurality of dictionary entries.

5. The CAM of claim 3 wherein the scheduler stops scheduling comparison of segments of the input word to the plurality of banks once a mismatch is detected, the mismatch based on the match line associated with the bank.

6. A content addressable memory (CAM) comprising:
   a plurality of dictionary words, the dictionary words divided into a plurality of banks;
   at least two input words, the input words divided into segments, the segments aligned with the plurality of banks; and
   a scheduler to schedule parallel comparison of different segments of the input words with the banks aligned to the respective different segments.

7. The CAM of claim 6 wherein the CAM is a ternary CAM (TCAM).

8. The CAM of claim 6, wherein a dictionary word mismatch for a bank indicates the entire dictionary word does not match the input word currently being compared to the bank.

9. The CAM of claim 8 wherein the scheduler is further to:
   stop scheduling comparisons for dictionary words that have been determined to not match the input word.

10. The CAM of claim 9 wherein the plurality of dictionary words divided into the plurality of banks further comprises:
    a match line for each bank of each dictionary word, the match line indicating the result of the comparison of the segment of the input word to the bank, wherein the match line is not pre-charged for dictionary words that have already been determined to not match the input word.

11. A method comprising:
   determining which bank of a plurality of banks of a dictionary entry has the highest probability of not matching a segment of an input word;
   pre-charging a match line associated with the determined bank; and
   comparing the segment of the input word to the bank, the match line indicating the result of the comparison.

12. The method of claim 11 wherein other banks of the dictionary entry are not pre-charged.

13. The method of claim 11 further comprising:
   incrementing a counter associated with the bank when the match line indicates the segment of the input word and the bank are not a match, wherein the probability of not matching is based on the counter.

14. The method of claim 11 further comprising:
   while the match line for the current bank indicates the segment of the input word and the bank are a match:
      determine which bank of the plurality of banks that have not already been compared has the highest probability of not matching;
      pre-charge the match line associated with the determined bank; and
      compare the segment of the input word to the bank, the match line indicating the result of the comparison.

15. The method of claim 14 further comprising:
   indicating the dictionary word matches the input word when all banks of the dictionary word indicate match.

16. A method comprising:
   receiving at least two input words for lookup in a content addressable memory, the content addressable memory being divided into banks, the content addressable memory including a plurality of dictionary words;
   dividing the input words into segments, the segments aligned with the banks;
   comparing, in parallel, a previously un-compared segment of each input word to the bank of the content addressable memory that aligns with the segment, wherein different segments are compared for each input word; and
   indicating dictionary entries for the input word as a mismatch if there is a mismatch in the bank currently being compared for the input word.

17. The method of claim 16, further comprising:
   while at least one dictionary entry does not indicate a mismatch and un-compared segments exist:
      compare, in parallel, a previously un-compared segment of each input word to the bank of the content addressable memory that aligns with the previously un-compared segment, wherein different segments are compared for each input word, wherein dictionary entries previously indicated as mismatches for the input word are excluded from the comparison; and
      indicate dictionary entries for the input word as a mismatch if there is a mismatch in the bank currently being compared for the input word.

18. The method of claim 17 further comprising:
   indicating as matches for an input word all dictionary entries that have been compared to all segments of the input word, with all segments indicating a match.

19. The method of claim 18 further comprising:
   selectively pre-charging match lines of each dictionary entry for each bank being compared based on if the dictionary entry for the input word does not already indicate a mismatch.

20. The method of claim 19 wherein the content addressable memory is a ternary content addressable memory.

* * * * *